United States Patent [19]

Iwasaki et al.

[11] 4,279,982

[45] Jul. 21, 1981

[54] PHOTOSENSITIVE COMPOSITIONS

[75] Inventors: Masayuki Iwasaki; Akira Nagashima, both of, Shizuoka; Shigeru Sato, Odawara, all of Japan

[73] Assignee: Fuji Photo Film Co., Ltd., Minami-ashigara, Japan

[21] Appl. No.: 101,040

[22] Filed: Dec. 6, 1979

[30] Foreign Application Priority Data

Dec. 8, 1978 [JP] Japan .................. 53-152150

[51] Int. Cl.$^3$ .................. G03C 1/72; G03C 1/52; G03C 1/68
[52] U.S. Cl. .................. 430/170; 430/916; 430/920; 430/288; 430/343; 430/175; 430/177; 430/191; 430/196; 430/278; 430/281; 430/286; 430/287; 430/339; 430/270; 204/159.15; 204/159.18; 204/159.23
[58] Field of Search .............. 430/916, 920, 343, 339, 430/196, 191, 344, 281, 278, 288, 286, 287, 175, 177, 170, 270; 548/143; 204/159.15, 159.18, 159.23

[56] References Cited

U.S. PATENT DOCUMENTS

| | | |
|---|---|---|
| 2,975,053 | 3/1961 | Schmidt et al. .................. 430/191 |
| 3,192,103 | 6/1965 | Sousa et al. .................. 548/143 |
| 3,418,118 | 12/1968 | Thommes et al. .................. 430/281 |
| 3,669,658 | 6/1972 | Yonezawa et al. .................. 430/191 |
| 3,708,297 | 1/1973 | Poot et al. .................. 430/343 |
| 3,970,535 | 7/1976 | McGinniss .................. 430/920 |
| 3,987,037 | 10/1976 | Bonham et al. .................. 430/920 |
| 4,040,922 | 8/1977 | Wang et al. .................. 430/920 |

*Primary Examiner*—Won H. Louie, Jr.
*Attorney, Agent, or Firm*—Sughrue, Rothwell, Mion, Zinn and Macpeak

[57] ABSTRACT

A photosensitive composition containing the 2-trihalomethyl-5-aryl-1,3,4-oxadiazole compound represented by the following general formula:

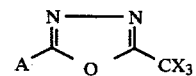

wherein X represents a chlorine atom or a bromine atom and A represents a phenyl group, a naphthyl group or a phenyl or naphthyl group substituted by a halogen atom, an alkyl group, an alkoxy group, a nitro group, a cyano group or a methylenedioxy group.

24 Claims, No Drawings

PHOTOSENSITIVE COMPOSITIONS

BACKGROUND OF THE INVENTION

1. Field of the Invention

This invention relates to a photosensitive composition containing a novel compound capable of forming a free radical upon exposure by light and, more particularly, the invention relates to a photosensitive composition containing a 2-trihalomethyl-5-aryl-1,3,4-oxadiazole compound.

2. Description of the Prior Art

Compounds which are decomposed upon exposure to light to form free radicals (hereinafter referred to as free radical generating agents) are well known in the graphic arts. These compounds are widely used as photopolymerization initiators for photopolymerizable compositions, photoactivators for free radical photographic compositions and photoinitiators for a reaction catalyzed by the acid formed by the action of light. Using such free radical generating agents various photosensitive materials useful for printing, reproduction, duplication, and other image forming systems are prepared.

An organic halogen compound provides a halogen free radical such as a chlorine free radical and a bromine free radical upon photodecomposition. These halogen free radicals are good hydrogen abstractors and produce acids when hydrogen donors are present. The applications of these compounds to photopolymerization and free radical photography are described in J. Kosar *Light-Sensitive Systems*, pages 180–181 and 361–370, published by J. Wiley & Sons, New York, 1965.

Typical examples of the compound forming a halogen free radical by the action of light are carbon tetrabromide, iodoform, tribromoacetophenone, etc., and they have been used widely. However, these free radical generating agents tend to sublime and have a bad odor and hence when these compounds are used for photosensitive materials having photosensitive layers formed on supports, they may be lost during production, use, and storage of the photosensitive materials as well present hygienic troubles. Also, these free radical generating agents have troubles on compatibility with other elements contained in the photosensitive layers. Furthermore, because these free radical generating agents have a low sensitivity (with respect to photodecomposition) to light sources usually used in case of producing, for example, printing plates (e.g., a metal halide lamp, etc.), a large amount of the compounds must be added to obtain sufficient effects. However, if a large amount of these compounds is present in photosensitive layers, they usually exert a very bad influence upon the mechanical property and developing property of the photosensitive layers.

Wang et al., U.S. Pat. No. 4,040,992 discloses the use of compounds of the following formula as photopolymerizable initiator:

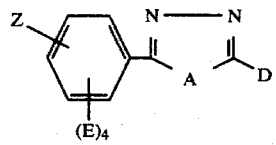

wherein A represents an oxygen atom, a sulfur atom, or —NR— (wherein R is a hydrogen atom or an alkyl group); Z represents —CH$_2$X, —CHX$_2$ or —CX$_3$ (wherein X is a halogen atom); E represents a hydrogen atom, a halogen atom, an alkyl group, an alkoxy group, an aryl group, an aryloxy group, a hydroxy group, an amino group, a carbonylalkoxy group, or a cyano group; and D represents an alkyl group, a substituted alkyl group, an aryl group, or a substituted aryl group.

However, even though these compounds have low volatility and have good compatibility with other various components used in photosensitive compositions, these compounds do not provide sufficient increase in sensitivity which would be practically useful when they are incorporated in photopolymerizable compositions or printing-out compositions.

SUMMARY OF THE INVENTION

An object of this invention is, therefore, to provide photosensitive compositions having excellent storage stability (i.e., they maintain their initial properties even after storage under controlled conditions for a long period of time).

Another object of this invention is to provide photosensitive compositions having a high sensitivity to a typical ultraviolet light source.

Still another object of this invention is to provide high sensitivity photosensitive compositions which can provide photosensitive layers having excellent physical properties and developing property.

As the result of various investigations toward the above-described objects of this invention, the present invention has resulted which is a photosensitive composition containing a 2-trihalomethyl-5-aryl-1,3,4-oxadiazole compound represented by the following formula (I):

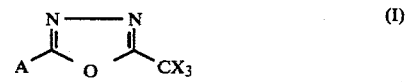

wherein X represents a chlorine atom or a bromine atom and A represents a phenyl group, a naphthyl group, or a phenyl or naphthyl group substituted by a halogen atom, an alkyl group, an alkoxy group, a nitro group, a cyano group or a methylenedioxy group.

DETAILED DESCRIPTION OF THE INVENTION

The substituted phenyl group or the substituted naphthyl group preferably contains 1 to 3 substituents. The substituents of the substituted phenyl group and the substituted naphthyl group represented by A are explained in more detail. The halogen atom is a chlorine, bromine or fluorine atom. The alkyl group is a straight chain, branched, or cyclic alkyl group preferably having 1 to 6 carbon atoms. Practical examples of the alkyl group are methyl, ethyl, propyl, isopropyl, butyl, sec-butyl, tert-butyl, pentyl, hexyl, cyclopentyl, and cyclohexyl groups. The alkoxy group is a straight chain, branched, or cyclic alkoxy group preferably having 1 to 6 carbon atoms. Practical examples of the alkoxy group are methoxy, ethoxy, propoxy, isopropoxy, butoxy, sec-butoxy, tert-butoxy, pentyloxy, hexyloxy, and cyclohexyloxy groups.

In the compounds represented by the formula (I), those wherein A is a substituted phenyl group or a substituted naphthyl group are preferred and, in particular, those wherein the substituent is an electron withdrawing group (i.e., a fluorine atom, a nitro group, a cyano group, etc.) or an alkoxy group are most preferred.

Practical examples of compounds of the formula (I) preferably used in this invention are illustrated below. These examples are not limiting.

Compound 1
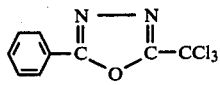

Compound 2
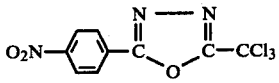

Compound 3
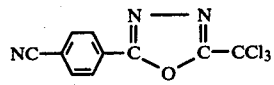

Compound 4
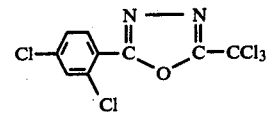

Compound 5
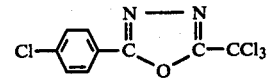

Compound 6
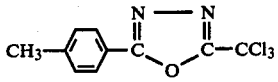

Compound 7
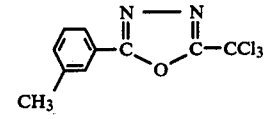

Compound 8
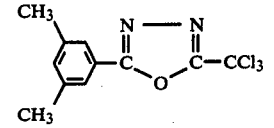

Compound 9
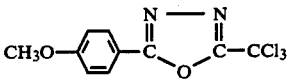

Compound 10
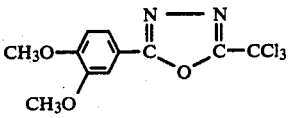

Compound 11
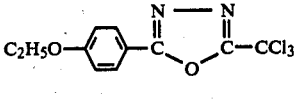

Compound 12
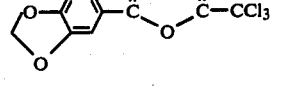

Compound 13

-continued

Compound 14
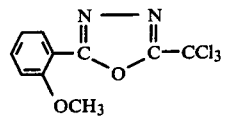

Compound 15
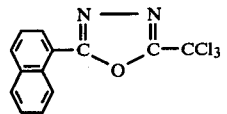

Compound 16
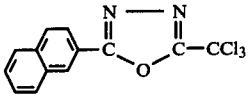

Compound 17
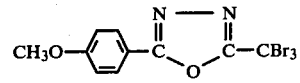

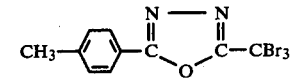

Of these compounds, particularly preferred are Compounds 2, 3, and 9 to 15.

The compounds represented by the general formula (I) may be prepared according to the processes described in, for example, M. P. Hutt, E. F. Elslager and L. M. Werbel, *Journal of Heterocyclic Chemistry*, Vol. 7, No. 3, page 511 et seq. (1970). The 2-trihalomethyl-5-aryl-1,3,4-oxadiazoles can be advantageously synthesized by a series of reactions represented by the following equations:

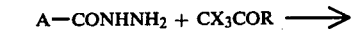

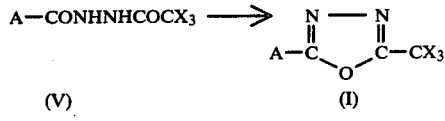

wherein A and X have the same definition as in the general formula (I), and R represents a trichloromethyl group, —O—COCX$_3$, a chlorine atom or a bromine atom.

Among arylcarboxylic acid hydrazides represented by the general formula (III) used for production of the compounds of the present invention in accordance with the above equations, preferred examples include hydrazides of benzoic acid, p-nitrobenzoic acid, p-cyanobenzoic acid, p-chlorobenzoic acid, 2,4-dichlorobenzoic acid, p-toluic acid, m-toluic acid, 3,5-dimethylbenzoic acid, p-methoxybenzoic acid, 3,4-dimethoxybenzoic acid, p-ethoxybenzoic acid, p-butoxybenzoic acid, 3,4-methylenedioxybenzoic acid, o-methoxybenzoic acid, α-naphthoic acid and β-naphthoic acid. Synthesis of these arylcarboxylic acid hydrazides can be carried out by the reaction of the corresponding arylcarboxylic acid ester with an equimolar or excess amount of hydrazine hydrate at from 0° C. to a refluxing temperature. Among compounds represented by the formula (III) used for production of the compounds (I), preferred examples include hexachloroacetone, hexabromoacetone, trichloroacetic acid anhydride, tribromoacetic acid anhydride, trichloroacetyl chloride and tribromoacetyl bromide. These compounds can be obtained commercially.

Production of the compounds (V) from compounds (III) and (IV) can be carried out by the following processes. For example: (1) a process of stirring an arylcarboxylic acid hydrazide with a slight excess of hexachloroacetone or hexabromoacetone in a solvent such as acetonitrile at from room temperature to a refluxing temperature, (2) a process of stirring an arylcarboxylic acid hydrazide with an equimolar amount of trihaloacetic acid anhydride at room temperature, and (3) a process of stirring 2 mols of an arylcarboxylic acid hydrazide with 1 mol of a trihaloacetyl halide using dioxane or tetrahydrofuran as a solvent at room temperature.

Production of 1,3,4-oxadiazoles from corresponding compounds (V) is carried out according to the process described in *J. Heterocyclic Chem.*, 7 (3) 511 (1970) written by M. P. Hutt, E. F. Elslager and L. M. Werbel. Compounds (I) can be thus prepared by the reaction of compounds (V) with an equimolar or excess amount of phosphorous oxychloride or acetic anhydride at from 50° to 120° C.

The preparation of the compounds of the formula (I) is illustrated by the following synthesis examples.

SYNTHESIS EXAMPLE 1

Synthesis of
2-trichloromethyl-5-(3',4'-dimethoxyphenyl)-1,3,4-oxadiazole (Compound 10)

A mixture of 9.8 g (0.05 mol) of methyl 3,4-dimethoxybenzoate and 15 ml of 85% water containing hydrazine was refluxed for 2.5 hours with stirring. The reaction mixture was cooled and the crystals formed were recovered by filtration and washed with water to provide 3,4-dimethoxybenzoic acid hydrazide. The yield was quantitative.

To 6.2 g (0.02 mol) of trichloroacetic acid anhydride was added under stirring 3.9 g (0.02 mol) of 3,4-dimethoxybenzoic acid hydrazide prepared in the above step followed by further stirring for 30 minutes and then after adding thereto 15 g (0.1 mol) of phosphorus oxychloride, the resultant mixture was refluxed for 3 hours with stirring. The reaction mixture was cooled and then added to 300 g of broken ice. The precipitates formed were collected by filtration, washed with water, dried, and recrystallized from ethyl acetate to provide 5.0 g of 2-trichloromethyl-5-(3',4'-dimethoxyphenyl)-1,3,4-oxadiazole. The melting point was 171° to 173° C. and the yield was 77%.

SYNTHESIS EXAMPLE 2

Synthesis of
2-trichloromethyl-5-α-naphthyl-1,3,4-oxadiazole (Compound 14)

A mixture of 21.5 g (0.116 mol) of methyl α-naphthoate, 50 ml of 80% water containing hydrazine, and 30 ml of methanol was refluxed for 3 hours and then the reaction mixture obtained was cooled to form crystals, which were recovered and washed with water to provide 19.0 g (yield 86%) of α-naphthoic acid hydrazide.

To a mixture of 100 ml of acetonitrile and 14.6 g (0.055 mol) of hexachloroacetone was added 9.3 g of α-naphthoic acid hydrazide thus obtained and the resultant mixture was refluxed with stirring for 4 hours. The precipitates formed were recovered by filtration to provide 14.6 g (yield 88%) of N-α-naphthoyl-N'-trichloroacetylhydrazine.

Then, 10 g (0.03 mol) of N-α-naphthoyl-N'-trichloroacetylhydrazine obtained was refluxed for 4.5 hours in 34 g (0.22 mol) of phosphorus oxychloride. The reaction mixture was cooled and added to 500 g of broken ice.

Precipitates formed were recovered by filtration, washed with water, and recrystallized from ethanol to provide 8.3 g of 2-trichloromethyl-5-α-naphthyl-1,3,4-oxadiazole. The melting point was 90° to 91.5° C. and the yield was 87%.

The compounds of the formula (I) very effectively form free radicals when irradiated by actinic light of about 250 nm to about 500 nm wavelength. Therefore, when the compounds of the formula (I) are used as the free radical generating agent in photosensitive compositions such as in photosensitive materials used for making lithographic printing plates, letterpress printing plates, intaglio printing plates, etc.; in photoresist materials; photosensitive compositions used for making other photographic elements; and in photosensitive compositions directly providing visible contrast between the exposed portions and unexposed portions by exposure alone; high sensitivity photosensitive compositions are obtained.

The compounds of this invention are particularly useful in directly providing visible contrast between exposed portions and unexposed portions upon light exposure without development (herein, referred to as "printout effect") in a photosensitive resist forming composition for making lithographic printing plates, IC circuits, photomasks, etc. Using photosensitive resist compositions having printout faculty, the images, which are visible under a yellow safety light in exposure work, can be obtained by light exposure alone. Thus, it is possible to determine, for example, whether the printing plate has been exposed or not in the event that printing work is interrupted when simultaneously exposing many printing plates. Similarly, when a large plate is repeatedly exposed for making a lithographic printing plate, it can be immediately confirmed whether and what portions were exposed.

The compositions used for providing such a printout faculty (hereinafter, referred to as print-out compositions) are composed of a free radical generating agent and a discoloring agent which is discolored by the free radical formed by the free radical generating agent, and according to this invention, the compounds shown in the formula (I) are used as the free radical generating agent.

There are two kinds of discoloring agents which can be used in this invention, i.e., a discoloring agent which is originally colorless but is converted into a colored state by the action of the photodecomposition product of the free radical generating agent and a discoloring agent which is itself colored and is discolored upon exposure.

Typical examples of the discoloring agent belonging to the former type are arylamines. As the arylamines suitable for the purpose, there are not only simple arylamines such as primary aromatic amines and secondary aromatic amines but also leuco dyes. Practical examples include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo- N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p''-hexamethyltriaminotriphenylmethane, p,p'-tetramethyldiaminotriphenylmethane, p,p'-tetramethyldiaminodiphenylmethylimine, p,p',p''-triamino-o-methyltriphenylmethane, p,p',p''-triaminotriphenylcarbinole, p,p'-tetramethylaminodiphenyl-4-anilinonaphthylmethane, p,p',p''-triaminotriphenylmethane, and p,p',p''-hexapropyltriaminotriphenylmethane.

Also, as the discoloring agents which are originally colored but are discolored or decolored by the photodecomposition products of the free radical generating agents, there are diphenylmethane series dyes, triphenylmethane series dyes, thiazine series dyes, oxazine series dyes, xanthene series dyes, anthraquinone series dyes, iminonaphthoquinone series dyes, azomethine dyes, etc. Practical examples of such discoloring agents are Brilliant Green, Eosine, Ethyl Violet, Erythrosine B, Methyl Green, Crystal Violet, Basic Fuchsine, phenolphthalein, 1,3-diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, diphenylthiocarbazone, 2,7-dichlorofluorescein, Paramethyl Red, Congo Red, Benzopurpurine 4B, α-Naphthyl Red, Nile Blue 2B, Nile Blue A, Phenacetaline, Methyl Violet, Malachite Green, Parafuchsine, Oil Blue #603 (trade name, made by Orient Kagaku Kogyo K.K.), Oil Pinc #312 (trade name, made by Orient Kagaku Kogyo K.K.), Oil Red 5B (trade name, made by Orient Kagaku Kogyo K.K.), Oil Scarlet #308 (trade name, made by Orient Kagaku Kogyo K.K.), Oil Red OG (trade name, made by Orient Kagaku Kogyo K.K.), Oil Red RR (trade name, made by Orient Kagaku Kogyo K.K.), Oil Green #502 (trade name, made by Orient Kagaku Kogyo K.K.), Spiron Red BEH Special (trade name, made by Hodogaya Kagaku Kogyo K.K.), m-cresol purple, Cresol Red, Rhodamine B, Rhodamine 6G, Fast Acid Violet R, sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone, 1-β-naphthyl-4-p-diethylaminophenylimino-5-pyrazolone, etc.

In the printout compositions of this invention, the compounds of the formula (I) have storage stability but leucotriphenylmethane series dyes used as the discoloring agents are generally liable to oxidize. Thus, in using these dyes it is effective to use a stabilizer. As the stabilizers effective for the purpose, there are the amines, zinc oxide and the phenols described in U.S. Pat. No. 3,042,575; the sulfur compounds described in U.S. Pat. No. 3,042,516; the alkali metal iodides and organic acids described in U.S. Pat. No. 3,042,518; the organic acid anhydrides described in U.S. Pat. No. 3,082,086; and the triaryl compounds of antimony, arsenic, bismuth or phosphor as described in U.S. Pat. No. 3,377,167.

The ratio of the compound of the formula (I) to the above-described discoloring agent in a printout composition is generally from about 0.01 part by weight to about 100 parts by weight, preferably about 0.1 to 10 parts by weight, most preferably about 0.5 to 5 parts by weight of the compound of the formula (I) per 1 part by weight of the discoloring agent.

On the other hand, the photosensitive resist forming compositions provided with printout faculty by the printout compositions of this embodiment of the invention include compositions used for making various printing plates such as lithographic printing plates, etc., as well as IC circuits, photomasks, etc. Typical examples are explained below.

(1) Compositions containing diazo resins

The diazo resin typified by a condensate of p-diazodiphenylamine and paraformaldehyde may be water-soluble or water-soluble but the diazo resin which is insoluble in water but soluble in an ordinary organic solvent is preferably used. As preferred photosensitive diazo compounds, there are compounds having two or more diazo groups in one molecule, such as a salt of the condensation products of p-diazodiphenylamine with formaldehyde or acetaldehyde. For example, the phenolate salt, the fluorocaprate salt and sulfonates thereof such as the triisopropylnaphthalene sulfonate salt, the 4,4'-biphenyldisulfonate salt, the 5-nitro-o-toluenesulfonate salt, the 5-sulfosalicylate salt, the 2,5-dimethylbenzenesulfonate salt, the 2-nitrobenzenesulfonate salt, the 3-chlorobenzenesulfonate salt, the 3-bromobenzenesulfonate salt, the 2-chloro-5-nitrobenzenesulfonate salt, the 2-fluorocaprylnaphthalenesulfonate salt, the 1-naphthol-5-sulfonate salt, the 2-methoxy-4-hydroxy-5-benzoylbenzenesulfonate salt or the p-toluenesulfonate salt. As other preferred diazo compounds, there are the condensation products of 2,5-dimethoxy-4-p-tolylmercaptobenzene diazonium salts with formaldehyde and condensation products of 2,5-dimethoxy-4-morpholinobenzene diazonium salts with formaldehyde or acetaldehyde.

Further, examples of useful diazo compounds include the compounds described in U.S. Pat. No. 2,649,373.

The diazo resin may be used alone as a photosensitive component for making resists but is preferably used together with a binder. As such a binder, various polymers can be used but the polymers containing a hydroxy group, an amino group, a carboxylic acid group, an amido group, a sulfonamido group, an active methylene group, a thioalcohol group, an epoxy group, etc., are preferred. Such preferred binders include shellacs such as described in British Pat. No. 1,350,521; polymers having a hydroxyethyl acrylate unit or a hydroxyethyl methacrylate unit as the main recurring unit such as described in British Pat. No. 1,460,978 and U.S. Pat. No. 4,123,276; polyamide resins such as described in U.S. Pat. No. 3,751,257; phenol resins such as described in British Pat. No. 1,074,392; polyvinylacetal resins such as a polyvinylformal resin and a polyvinylbutyral resin; linear polyurethane resins such as described in U.S. Pat. No. 3,660,097; phthalated resins of polyvinyl alcohol; epoxy resins formed by the condensation of bisphenol A and epichlorohydrin; polymers containing an amino group such as polyaminostyrene and polyalkylamino acrylate or polyalkylamino methacrylate; and celluloses such as cellulose acetate, cellulose alkyl ether, cellulose acetate phthalate, etc.

The proper proportion of the binder is about 40 to 95% by weight of the photosensitive resist forming composition. If the proportion of the binder increases (i.e., the proportion of the diazo resin decreases), the photosensitivity of the photosensitive composition increases as a matter of course but the storage stability becomes poor. The optimum proportion of the binder is about 70 to 90% by weight.

The composition containing the diazo resin may contain additives such as dyes, pigments other than the color changing agent (or discoloring agent), such as phosphoric acid as described in U.S. Pat. No. 3,236,646.

(2) Compositions of o-quinonediazide compounds

Particularly preferred o-quinonediazide compounds are o-naphthoquinonediazide compounds such as described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443 as well as many other publications. Among these compounds, the o-naphthoquinonediazidocarboxylic acid ester or the o-naphthoquinonediazidosulfonic acid ester of an aromatic hydroxy compound and the o-naphthoquinonediazidosulfonic acid amide or the o-naphthoquinonediazidocarboxylic acid amide of an aromatic amino compound are particularly preferred. In particular, the product obtained by the esterification reaction of the condensate of pyrogallol and acetone and o-naphthoquinonediazidosulfonic acid as described in U.S. Pat. No. 3,635,709; the product obtained by the esterification reaction of a polyester having a terminal hydroxy group and o-naphthoquinonediazidosulfonic acid or o-naphthoquinonediazidocarboxylic acid as described in U.S. Pat. No. 4,028,111; the product obtained by the esterification reaction of the homopolymer of p-hydroxystyrene or a copolymer of p-hydroxystyrene and a monomer copolymerizable with styrene and o-naphthoquinonediazidosulfonic acid or o-naphthoquinonediazidocarboxylic acid as described in British Pat. No. 1,494,043; and the product obtained by the amido reaction of a copolymer of p-aminostyrene and another monomer copolymerizable with it and o-naphthoquinonediazidosulfonic acid or o-naphthoquinonediazidocarboxylic acid as described in U.S. Pat. No. 3,759,711 are very excellent.

These o-quinonediazide compounds may be used alone but are preferably used as a mixture with an alkalisoluble resin. The preferred alkali-soluble resin is a novolak type phenol resin. Particularly, there are a phenol-formaldehyde resin, an o-cresol-formaldehyde resin, an m-cresol-formaldehyde resin, etc. Furthermore, it is more preferred to use the above-described phenol resin together with a condensate of formaldehyde and a phenol or cresol substituted by an alkyl group of 3 to 8 carbon atoms, such as a t-butylphenol-formaldehyde resin as described in U.S. Pat. No. 4,123,279. The content of the alkali-soluble resin is from about 50 to about 85% by weight, preferably 60 to 80% by weight based on the total weight of the photosensitive resist forming composition.

The photosensitive composition composed of the o-quinonediazide compound may contain, as the case may be, pigments or dyes which are not the discoloring agent and plasticizers, etc.

(3) Compositions of photosensitive azide compounds

Suitable photosensitive azide compounds are aromatic azide compounds wherein an azide group is bonded to the aromatic ring directly or through a carbonyl group or a sulfonyl group, These aromatic azide compounds form a nitrene upon decomposition of the azide group by the action of light and the nitrene causes various reactions to insolubilize the compounds.

Preferred aromatic azide compounds are the compounds having one or more groups such as an azidophenyl group, an azidostyryl group, an azidobenzal group, an azidobenzoyl group, and an azidocinnamoyl group. Practical examples of these compounds are 4,4'-diazidochalcon, 4-azido-4'-(4-azidobenzoylethoxy)chalcon, N,N-bis-p-azidobenzal-p-phenylenediamine, 1,2,6-tri(4'-azidobenzoxy)-hexane, 2-azido-3-chlorobenzoquinone, 2,4-diazido-4'-ethoxyazobenzene, 2,6-di(4,40-azidobenzal)-4-methylcyclohexanone, 4,4'-diazidobenzophenone, 2,5-diazido-3,6-dichlorobenzoquinone, 2,5-bis(4-azidostyryl)-1,3,4-oxadiazole, 2-(4-azidocinnamoyl)thiophene, 2,5-di(4'-azidobenzal)cyclohexanone, 4,4'-diazidodiphenylmethane, 1-(4-azidophenyl)-5-furyl-2-penta-2,4-diene-1-one, 1-(4-azidophenyl)-5-(4-methoxyphenyl)penta-1,4-diene-3-one, 1-(4-azidophenyl)-3-(1-naphthyl)propene-1-one, 1-(4-azidophenyl)-3-(4-dimethylaminophenyl)propane-1-one, 1-(4-azidophenyl)-5-phenyl-1,4-pentadiene-3-one, 1-(4-azidophenyl)-3-(4-nitrophenyl)-2-propene-1-one, 1-(4-azidophenyl)-3-(2-furyl)-2-propene-1-one, 1,2,6-tri(4'-azidobenzoxy)hexane, 2,6-bis(4-azidobenzylidyne-p-t-butyl)-cyclohexanone, 4,4'-diazidobenzalacetone, 4,4'-diazidostilbene-2,2'-disulfonic acid, 4'-azidobenzalacetophenone-2-sulfonic acid, 4,4'-diazidostilbene-α-carboxylic acid, di(4-azido-2'-hydroxybenzal)acetone-2-sulfonic acid, 4-azidobenzalacetophenone-2-sulfonic acid, 2-azido-1,4-dibenzenesulfonylaminophthalene, 4,4'-diazidostilbene-2,2'-disulfonic acid anilide, etc.

Besides these low molecular weight aromatic azide compounds, the azide group-containing polymers described in U.S. Pat. Nos. 3,345,171, 3,467,630, and 3,453,108, and British Pat. Nos. 1,118,213 and 1,138,929 can be used.

These photosensitive azide compounds are preferably used together with high molecular weight materials or polymers as a binder. A preferred binder is an alkalisoluble resin, for example, natural resins such as shellac, rosin, etc.; novolak type phenol resins such as a phenol-formaldehyde resin, m-cresol-formaldehyde resin, etc.; a homopolymer of an unsaturated carboxylic acid or a copolymer thereof with a monomer copolymerizable with the carboxylic acid, such as, for example, polyacrylic acid, polymethacrylic acid, a methacrylic acid-styrene copolymer, a methacrylic acid-methyl acrylate copolymer, a styrene-maleic anhydride copolymer, etc.; partially or completely saponificated polyvinyl acetate resins partially acetalated by an aldehyde such as acetaldehyde, benzaldehyde, hydroxybenzaldehyde, carboxybenzaldehyde, etc.; and polyhydroxystyrene. Furthermore, organic solvent-soluble resins as cellulose alkyl ethers such as cellulose methyl ether, cellulose ethyl ether, etc., can be also used as the binder.

It is preferred that the proportion of the binder be in the range of from about 10% by weight to about 90% by weight of the total amount of the composition composed of the photosensitive azide compound.

The composition composed of the photosensitive azide compound may further contain dyes and pigments which are not the discoloring agents, plasticizers such as phthalic acid esters, phosphoric acid esters, aliphatic carboxylic acid esters, glycols, sulfonamides, etc.; and sensitizers such as Michler's ketone, 9-fluorenone, 1-nitropyrene, 1,8-dinitropyrene, 2-chloro-1,2-benzanthraquinone, 2-bromo-1,2-benzanthraquinone, pyrene- 1,6-quinone, 2-chloro-1,8-phthaloylnaphthalene, cyanoacridine, etc.

(4) Photosensitive compositions containing a polymer having a

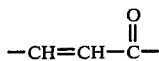

moiety in the main chain or the side chain

These compositions include compositions containing a photosensitive polymer such as a polyester, a polyamide, amide, and a polycarbonate having

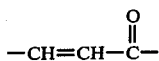

as the photosensitive group in the main chain or the side chain of the polymer as the main component (e.g., U.S. Pat. Nos. 3,030,208, 3,707,373, and 3,453,237); compositions containing a photosensitive polyester produced from a (2-propenylidene)malonic acid compound such as cinnamylidenemalonic acid, etc., and a difunctional glycol (e.g., photosensitive polymers such as described in U.S. Pat. Nos. 2,956,878 and 3,173,787); the cinnamic acid ester of a hydroxy group-containing polymers such as polyvinyl alcohol, starch, cellulose, or the like (the photosensitive polymers as described in U.S. Pat. Nos. 2,690,966, 2,752,372, and 2,732,301). These compositions may further contain sensitizers, stabilizers, plasticizers as well as dyes and pigments which are not the discoloring agent.

In another embodiment of the present invention the compounds of the formula (I) may be used as the photopolymerization initiator in photopolymerizable compositions containing unsaturated addition polymerizable compounds. These compositions are preferably composed of (a) a vinyl monomer having at least two terminal vinyl groups, (b) a photopolymerization initiator, and (c) a polymeric binder. A preferred amount of the compounds of the formula (I) in photosensitive compositions is from about 0.01 to about 100 parts by weight, more preferably from about 0.1 to about 50 parts by weight based on 100 parts by weight of the photosensitive resist forming composition.

As the vinyl monomer components (a), there are the monomers described in U.S. Pat. Nos. 3,261,686 and 3,380,831 and British Pat. No. 1,154,872, for example, acrylic acid esters and methacrylic acid esters of polyols, such as diethylene glycol diacrylate, diethylene glycol dimethacrylate, triethylene glycol diacrylate, triethylene glycol dimethacrylate, pentaerythritol triacrylate, pentaerythritol trimethacrylate, trimethylolpropane triacrylate, trimethylolpropane trimethacrylate, etc.; bisacrylamides or bismethacrylamides such as methylenebisacrylamide, methylenebismethacrylamide, ethylenebisacrylamide, ethylenebismethacrylamide, etc.; and the reaction product of a diisocyanate and an unsaturated monomer having a urethane group such as di(2'-methacryloxyethyl)-2,4-tolylenediurethane, di(2'-acryloxyethyl)trimethylenediurethane, etc.

The compounds of the formula (I) are preferably used as the photopolymerization initiators, component (b), although other compounds may also be used. For example, there are the carbonyl compounds, organic sulfur compounds, peroxides, redox compounds, azo and diazo compounds, halogen compounds, and photoreducible dyes as described in J. Kosar, Light Sensitve Systems, Chapter 5. Furthermore, practical examples of these compounds are described in British Pat. No. 1,459,563.

On the other hand, as the binder (c), various known polymers can be used. Practical examples of such polymers are described in detail in U.S. Pat. No. 4,072,527. Furthermore, the chlorinated polyolefins described in British Pat. No. 1,459,563 are particularly preferred binders.

The component (b) and component (c) are used in a weight ratio of about 1:9 to 6:4. Component (b) is present in an amount of 0.5 to 10% by weight based on the amount of the component (a).

The photopolymerizable compositions may further contain thermal polymerization inhibitors, plasticizers, and dyes and pigments which are not the discoloring agent.

The printout composition of the present invention may be incorporated in a photosensitive resist forming composition. The printout composition is used in an amount of about 0.1 part by weight to about 150 parts by weight, preferably 1 to 60 parts by weight per 100 parts by weight of the photosensitive resist forming composition.

The photosensitive resist forming composition endowed with such a printout faculty is coated using a solvent such as ethylene dichloride, cyclohexanone, methyl ethyl ketone, 2-methoxyethyl acetate, monochlorobenzene, toluene, ethyl acetate, etc., and mixtures thereof.

Photosensitive resist forming compositions endowed with such a printout faculty are advantageously used in a photosensitive layer for a photosensitive lithographic printing plate (a so-called "presensitized plate" or "PS plate"). In this case, the support for the photosensitive lithographic printing plate include metal plates such as aluminum plates (including aluminum alloys), zinc plates, iron plates, copper plates as well as plastic sheets having laminated or vapor deposited thereon such a metal. The most preferred support is an aluminum plate.

In the case of using a metal support, in particular a support having an aluminum surface, it is preferred that the support be subjected to a surface treatment such as graining, immersion in an aqueous solution of sodium silicate, potassium fluorozirconate, a phosphate, etc.; or anodic oxidation. Also, an aluminum plate which is grained and subjected to immersion treatment in an aqueous solution of sodium silicate as described in U.S. Pat. No. 2,714,066 and an aluminum plate which is subjected to anodic oxidation and then to immersion in an aqueous solution of an alkali metal silicate as described in U.S. Pat. No. 3,181,461 are preferably used.

The above-described anodic oxidation treatment is practiced by passing an electric current through an aluminum plate as an anode in an aqueous solution or a non-aqueous solution of an inorganic acid such as phosphoric acid, chromic acid, sulfuric acid, bromic acid, etc., or an organic acid such as oxalic cid, sulfamic acid, etc., or salts thereof as the single solution or a combination of the solutions, more particularly an aqueous solution of phosphoric acid, sulfuric acid or a mixture of them.

The electric deposition of silicate as described in U.S. Pat. No. 3,658,662 is also effective. Furthermore, an aluminum plate which is electrolyzed in hydrochloric acid electrolyte by an alternating current and then subjected to an anodic oxidation in a sulfuric acid electrolyte as described in British Pat. No. 1,208,224 is often preferred. It may be desirable to form a subbing layer of a cellulosic resin containing a water-soluble salt of a metal such as zinc, etc., on an aluminum plate which is subjected to anodic oxidation as described above to prevent the formation of scum on printing.

The coverage of the photosensitive layer formed on the support as described above is in a range of from about 0.1 g/m² to about 7 g/m², preferably about 0.5 to 4 g/m².

The PS plate thus prepared is imagewise exposed and then subjected to processings including development in an ordinary manner to form images thereon. For example, in the case of a PS plate having a photosensitive layer composed of the photosensitive composition having the printout composition contained in the above-mentioned composition (1) composed of the diazo resin, the PS plate is imagewise exposed and then the non-exposed protions of the photosensitive layer are removed by development, thereby a lithographic printing plate is obtained. In the PS plates having any sort of photosensitive layers, the PS plates may be developed using known developers suitable for each photosensitive composition without need of specific technique for the photosensitive composition endowed with the printout faculty by this invention.

The photosensitive resist forming composition endowed with the printout faculty described above can also be used for making proof plates for prints, films for overhead projectors, and films for secondary originals. As the supports suitable for these materials, there are transparent films such as polyethylene terephthalate films, cellulose triacetate films, etc., and plastic films the surface of which has been chemically or mechanically matted.

Furthermore, the above-described photosensitive resist forming compositions can be used for making films for photomasks. Supports suitable for the purpose are polyethylene terephthalate films vapor-deposited with aluminum, an aluminum alloy or chromium and polyethylene terephthalate films having a colored layer thereon.

Still further, the aforesaid photosensitive compositions can be used as photoresists. In this case, copper plates, copper-plated plates, stainless steel plates, glass sheets, etc., can be used as the supports.

It is astonishing that the free radical generating agent of this invention is decomposed by the action of light in a photosensitive resist forming compositions containing various photosensitive resist forming compounds and effectively discolors a copresent discoloring agent and, as the result of such discoloring, a clear boundary is obtained between the exposed portions and unexposed portions, which provides visible images having high contrast.

Furthermore, since the free radical generating agents used in this invention have storage stability, when the materials are used for PS plates, the shelf life of the PS plates is improved. Moreover, because the photodecomposition reaction of the free radical generating agent of this invention is very fast and the free radical generating agent is influenced little by a photosensitive resist forming compound existing together with the agent, an effective result is obtained with the addition of a small amount of the agent.

The free radical generating agents of the invention do not significantly obstruct photodecomposition of the photosensitive resist forming compositions, e.g., the above-mentioned compositions (1) and (2) and they do not reduce the light sensitivity of the photosensitive resist forming composition (light sensitivity of resist). Furthermore, since the free radical generating agents in this invention are effective even in small amounts, they do not degrade the various physical properties of the resist images obtained by imagewise exposing and developing the photosensitive resist forming composition. For example, properties such as developability, ink-receptivity, printing stain, printing resistance, etc., of the printing plates obtained using the photosensitive resist forming composition endowed with a printout faculty are the same as those of the printing plates not using the free radical generating agent of this invention.

The free radical generating agents used in this invention may be structurally similar to the photopolymerizable compositions described in U.S. Pat. No. 4,040,922 issued to Wang et al but there is an essential difference. The photoinitiators of Wang et al are represented by the following general formula II:

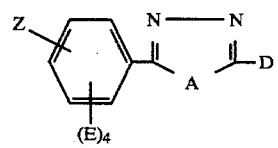

wherein A represents an oxygen atom, a sulfur atom, or —NR— wherein R is a hydrogen atom or an alkyl group; Z represents —$CH_2X$, —$CHX_2$ or —$CX_3$ wherein X is a halogen atom; E represents a hydrogen atom, a halogen atom, an alkyl group, an alkoxy group, an aryl group, an aryloxy group, a hydroxy group, an amino group, a carbonylalkoxy group, or a cyano group; and D represents an alkyl group, a substituted alkyl group, an aryl group, or a substituted aryl group.

As confirmed in Example 3 of the patent, the Z substituent of the phenyl group is an essential moiety for the function as the photoinitiator. Also, there are no description in the specification of the U.S. Patent about the effect of the compound of the general formula II wherein the substituent D is a substituted alkyl group on the properties as the photoinitiator.

On the other hand, it has been discovered that the compound having —$CX_3$ group directly bonded to the oxadiazole ring as shown in the general formula (I) has an effective photoinitiating property. That is, it has been found in this invention that the substituent of group A in the general formula (I) in the invention is not necessarily a halomethyl group and the photoinitiating property of the compounds shown by the general formula (I) is far superior to the compounds by Wang et al as will be described later. Furthermore, the compounds of Wang et al are produced in a low yield (40%) as shown (Example 1 Wang et al) but the compounds of this invention can be produced at a relatively high yield (70-80%) as shown in Synthesis Examples 1 and 2 described above.

The invention will further be described in more detail by the following examples.

EXAMPLE 1

An aluminum plate 0.24 mm thick which had been grained and subjected to an anodic oxidation was coated with a coating solution having the following composition and dried for 2 minutes at 100° C.

| | |
|---|---|
| Polyester (molecular weight of about 8,000) prepared by the condensation of ethyl p-phenylenediacrylate and an equimolar amount of 1,4-bis-β-hydroxyethoxycyclohexane | 0.5 g |
| 2-Benzoylmethylene-3-methyl-β-naphthothiazoline | 0.03 g |
| Free radical generating agent (Table 1) | 0.008 g |
| Leucocrystal Violet | 0.008 g |
| Monochlorobenzene | 9 g |
| Ethylene dichloride | 6 g |

The coverage of the coating solution after drying was 1.2 g/m². By following the same procedure as above, eight sample photosensitive lithographic printing plates (including one control sample and one comparison sample) were prepared using the free radical generating agents shown in Table 1.

Each of the photosensitive lithographic printing plates was exposed through a negative transparency for 40 seconds to a metal halide lamp of 2 kw at a distance of 1 meter and the optical densities of the photosensitive layer at the exposed portions and unexposed portions were measured using a Macbeth reflection densitometer. The image obtained by light exposure was sharper or clearer as the difference (ΔD) between the optical density of the exposed portion and that of the unexposed portion increased. Also, each of the photosensitive lithographic printing plates were exposed through a grey scale (having 21 steps, the optical density difference between two adjacent steps was 0.15 and the optical density of the first step was 0.1) under the same conditions as above and then developed by wiping the surface thereof with a developer having the following composition, whereby the resist sensitivity was determined. The sensitivity was shown by the step number (as the step number is larger, the sensitivity is higher).

| | |
|---|---|
| γ-Butyrolactone | 1000.0 ml |
| Glycerol | 100.0 ml |
| Methyl Abieate | 10.0 ml |
| Hydrogenated Wood Resin (Staybelite Resin, made by Hercules Powder Co.) | 1.0 g |
| Wetting Agent (Zonyl A, made by E.I. Du Pont de Nemours Company) | 10.2 ml |
| Phosphoric Acid (85%) | 25.0 ml |
| Distilled Water | 100.0 ml |

TABLE 1
Property of Photosensitive Lithographic Printing Plate

| Example No. | Free Radical Generating Agent | Sensitivity | Optical Density (D) of Photosensitive Layer | | |
|---|---|---|---|---|---|
| | | | Unexposed Portion | Exposed Portion | ΔD |
| | Control | 10 steps | 0.32 | 0.39 | 0.07 |
| 2 | No. 5 | 10 steps | 0.33 | 0.54 | 0.21 |
| 3 | No. 9 | 10 steps | 0.33 | 0.55 | 0.22 |
| 4 | No. 10 | 10 steps | 0.33 | 0.59 | 0.26 |
| 5 | No. 11 | 10 steps | 0.33 | 0.54 | 0.21 |
| 6 | No. 13 | 10 steps | 0.33 | 0.54 | 0.21 |
| 7 | No. 14 | 10 steps | 0.33 | 0.58 | 0.25 |
| 8 | Comparison | 10 steps | 0.32 | 0.43 | 0.11 |

In the above table, no free radical generating agent was used in the control experiment and the following compound was used in the comparison experiment:

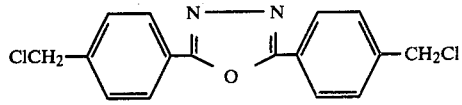

From the results shown in Table 2, it is understood that the free radical generating agents of this invention provide printout images having a contrast more than twice as high as 2,5-bis(p-chloromethylphenyl)-1,3,4-oxadiazole described in U.S. Pat. No. 4,040,922 by Wang et al.

EXAMPLE 2

The aluminum plate of Example 1 was coated with a coating solution having the following composition and dried for 2 minutes at 100° C.

| | |
|---|---|
| Esterification reaction product of naphthoquinone-(1,2)-diazido-(2)-5-sulfonylchloride and cresol novolak resin | 0.75 g |
| Cresol Novolak Resin | 2.10 g |
| Tetrahydrophthalic Acid Anhydride | 0.15 g |
| Compound 10 | 0.04 g |
| Crystal Violet | 0.01 g |
| Oil Blue #603 (made by Orient Kagaku Kogyo K.K.) | 0.01 g |
| Ethylene Dichloride | 18 g |
| 2-Methoxyethyl Acetate | 12 g |

The coverage of the coating solution after drying was 2.1 g/m².

The photosensitive lithographic printing plate thus obtained could provide a clear printout image by image exposure only without development. Since the exposed portions were discolored but the unexposed portions kept the original density or color, the image formed could be distinguished even in fine portions under a safety lamp.

EXAMPLE 3

The aluminum plate used in Example 1 was coated with a coating solution having the following photosensitive composition to provide a photosensitive lithographic printing plate.

| | |
|---|---|
| Esterification product of naphthoquinone-(1,2)-diazido-(2)-5-sulfonylchloride and poly-p-hydroxystyrene (molecular weight of 7,000) | 0.70 g |
| Cresol Novolak Resin | 2.25 g |
| p-tert-Butylphenol Novolak Resin | 0.05 g |
| Tetrahydrophthalic Acid Anhydride | 0.15 g |
| Compound 14 | 0.04 g |
| Oil Blue #603 (Orient Kagaku Kogyo K.K.) | 0.02 g |
| Tetrahydrofuran | 18 g |
| 2-Methoxyethyl Acetate | 12 g |

By imagewise exposing the photosensitive plate, a clear printout image was obtained without development.

EXAMPLE 4

The aluminum plate used in Example 1 was coated with a coating composition having the following photosensitive composition to provide a photosensitive lithographic printing plate. By imagewise exposing the photosensitive plate, a clear printout image could be obtained without need of development.

| Esterification product od naphthoquinone-(1,2)-diazido-(2)-5-sulfonylchloride and pyrogallol acetone resin (prepared by the method described in U.S. Pat. No. 3,635,709) | 0.75 g |
|---|---|
| Cresol Novolak Resin | 2.10 g |
| p-tert-Butylphenol Novolak Resin | 0.05 g |
| Tetrahydrophthalic Acid Anhydride | 0.15 g |
| Thymol Blue | 0.02 g |
| Compound 10 | 0.03 g |
| Ethylene Dichloride | 18 g |
| 2-Methoxyethyl Acetate | 12 g |

EXAMPLE 5

The non-coated aluminum plate as used in Example 1 was coated with a coating solution having the following composition and dried for 2 minutes at 100° C.

| p-Toluenesulfonate of the condensate of p-diazophenylamine and paraformaldehyde | 0.2 g |
|---|---|
| Polyvinyl Formal | 0.75 g |
| Compound 10 | 0.02 g |
| Crystal Violet | 0.02 g |
| 2-Methoxy Ethanol | 20 g |
| Methanol | 5 g |

The dry coverage of the coated composition was 1.0 g/m².

The photosensitive lithographic printing plate was exposed for 30 seconds to a carbon arc lamp of 30 amperes with a distance of 70 cm. In this case, since the exposed portions were faded but the unexposed portions kept the original density or color, the printout image obtained could be recognized in fine portions under a safety lamp.

Also, the plate was immersed in a developer having the following composition for 1 minute at room temperature and then the unexposed portions were removed by lightly rubbing the surface thereof with an adsorbent cotton, thereby a lithographic printing plate was obtained.

| Sodium di(2-ethylhexyl)phosphate | 10 g |
|---|---|
| Water | 90 g |

EXAMPLE 6

An aluminum plate was coated with a coating solution having the following composition as in Example 1 and dried.

| p-Toluenesulfonate of the condensate p-diazophenylamine and paraformaldehyde | 0.2 g |
|---|---|
| Polyvinyl Formal | 0.75 g |
| Compound 10 | 0.04 g |
| N,N-Dimethylaniline 0.02 g | |
| 2-Methoxy Ethanol | 20 g |
| Methanol | 5 g |

The dry coverage of the coating composition was 1.0 g/m². When the photosensitive lithographic printing plate was imagewise exposed, the exposed portions became purple, while the unexposed portions kept original yellow color, thereby a printout image which could be recognized even in fine portions under a safety lamp was obtained.

EXAMPLE 7

An aluminum plate was coated with a coating solution having the following composition as in Example 6 and dried.

| Esterification reaction product of polyvinyl alcohol (saponification degree of 88%, polymerization degree of 1,000) and p-azidobenzoic acid | 0.5 g |
|---|---|
| 1-Nitro-4-acetaminonaphthalene | 0.02 g |
| Compound 4 | 0.008 g |
| Leucocrystal Violet | 0.008 g |
| Dioctyl Phthalate | 0.1 g |
| Ethylene Dichloride | 6 g |
| Monochlorobenzene | 9 g |

When the photosensitive lithographic printing plate was imagewise exposed, a printout image having a high contrast was obtained.

EXAMPLE 8

An aluminum plate was coated with a coating solution having the following photosensitive composition as in Example 1 and dried.

| Copolymer of methyl methacrylate and methacrylic acid (9:1 in copolymerization ratio) | 0.62 g |
|---|---|
| Trimethylolpropane Triacrylate | 0.38 g |
| 2-Benzoylmethylene-3-methyl-β-naphthothiazoline | 0.02 g |
| Compound 10 | 0.04 g |
| Leucocrystal Violet | 0.008 g |
| Methyl Ethyl Ketone | 10 g |

When the photosensitive lithographic printing plate was imagewise exposed, a printout image enriched with contrast was obtained.

Thereafter, when the unexposed portions were removed by a developer consisting of 1.2 g of sodium hydroxide, 300 ml of isopropyl alcohol, and 900 ml of water, a lithographic printing plate was obtained.

EXAMPLE 9

For comparison Example 8 was repeated using the free radical generating agent shown in Table 2 for Compound 10. The photosensitive composition used in Run No. 1 (Control) did not contain the free radical generating agent according to the present invention and in Run No. 3, 2,5-bis(p-chloromethylphenyl)-1,3,4-oxadiazole having the following formula was used in the same photosensitive composition in place of Compound 10.

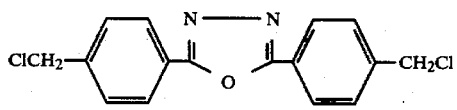

The conditions for exposure, and the method for determination of density and sensitivity used were the same as those used in Example 1. The results are shown in Table 2.

TABLE 2

| | Property of Photosensitive Lithographic Printing Plate | | | |
|---|---|---|---|---|
| | Free Radical | Sensi- | Optical Densituy (D) of Photosensitive Layer | | |
| Run No. | Generating Agent | tivity | Unexposed Portion | Exposed Portion | ΔD |
| 1 | Control | 4 | 0.30 | 0.38 | 0.08 |
| 2 | Compound 10 | 8 | 0.30 | 0.58 | 0.28 |
| 3 | Comparison | 4 | 0.30 | 0.41 | 0.11 |

As is apparent from the results shown in Table 2, the addition of Compound 10 to the photopolymerizable composition markedly improves the printing-out sensitivity as well as the resist-forming sensitivity, whereas 2,5-bis(p-chloromethylphenyl)-1,3,4-oxadiazole does not increase the above sensitivities to a degree which is practically useful.

While the invention has been described in detail and with reference to specific embodiments thereof, it will be apparent to one skilled in the art that various changes and modifications can be made therein without departing from the spirit and scope thereof.

What is claimed is:

1. A printout composition for providing printout faculty comprising the 2-trihalomethyl-5-aryl-1,3,4-oxadiazole compound represented by the following general formula and a discoloring agent, said discoloring agent being an arylamine inherently colorless but being colored upon reaction with the photodecomposition product of the compound of the formula, or said discoloring agent being originally colored but is discolored upon reaction with said photodecomposition product and being selected from the group consisting of a diphenylmethane series dye, a triphenylmethane series dye, a thiazine series dye, an oxazine series dye, a xanthene series dye, an anthraquinone series dye, an imino naphtholquinone series dye, and an azomethine series dye:

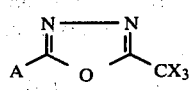

wherein X represents a chlorine atom or a bromine atom and A represents a phenyl group, a naphthyl group or a phenyl or naphthyl group substituted by a halogen atom, an unsubstituted alkyl group, an alkoxy group, a nitro group, a cyano group or a methylenedioxy group.

2. The printout composition of claim 1, wherein said arylamine is a primary aromatic amine, a secondary aromatic amine or a leuco dye.

3. The printout composition of claim 1, wherein said composition contains further a stabilizer.

4. The printout composition of claim 1 additionally comprising a photosensitive resist forming material.

5. The printout composition of claim 4, wherein said photosensitive resist forming composition comprises a diazo resin, an o-quinonediazide compound, a photosensitive azide compound, a polymer having a

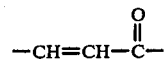

moiety in the main chain or side chain, or an addition polymerizable unsaturated compound.

6. The printout composition of claim 4, wherein said resist forming material is a condensate of a p-diazophenylamine and paraformaldehyde.

7. The printout composition of claim 4, wherein said resist forming material is an o-naphthoquinonediazide compound.

8. The printout composition of claim 5, wherein said resist forming material is an aromatic azide compound wherein an azide group is bonded to the aromatic ring directly or through a carbonyl group or a sulfonyl group.

9. The printout composition of claim 4, wherein said resist forming material composed of the addition polymerizable unsaturated compound is a composition composed of a vinyl monomer having at least two terminal vinyl groups, a photopolymerization initiator, and a binder.

10. A printout material comprising a support having formed thereon a photosensitive layer comprising the photosensitive composition of claim 4.

11. The photosensitive material of claim 10, wherein said support is an aluminum plate.

12. The printout composition of claim 4, wherein said discoloring agent is a leuco dye.

13. The printout composition of claim 1, wherein said compound of the formula (I) is present in an amount of about 0.01 to about 100 parts by weight per part by weight of said discoloring agent.

14. The printout composition of claim 4, wherein said compound of the formula (I) is present in an amount of about 0.01 to about 100 parts by weight per 1 part by weight of the discoloring agent.

15. The printout composition of claim 4, wherein the combined amount of said discoloring agent and said compound of the formula (I) in said composition is about 0.1 to about 150 parts by weight per 100 parts by weight of the photosensitive resist forming material.

16. The printout composition of claim 4, wherein said arylamine is a primary aromatic amine, a secondary aromatic amine or a leuco dye.

17. The printout composition of claim 9, wherein said photopolymerization initiator is selected from the group consisting of carbonyl compounds, organic sulfur compounds, peroxides, redox compounds, azo and diazo compounds, halogen compounds and photoreducible dyes.

18. The printout composition of claim 9, wherein a weight ratio of the vinyl monomer to the photopolymerization initiator is about 1:9 to 6:4, and the photopolymerization initiator is present in an amount of 0.5 to 10% by weight based on the amount of the binyl monomer.

19. The printout composition of claim 1, wherein the compound of the formula (I) is

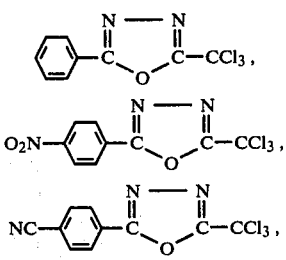

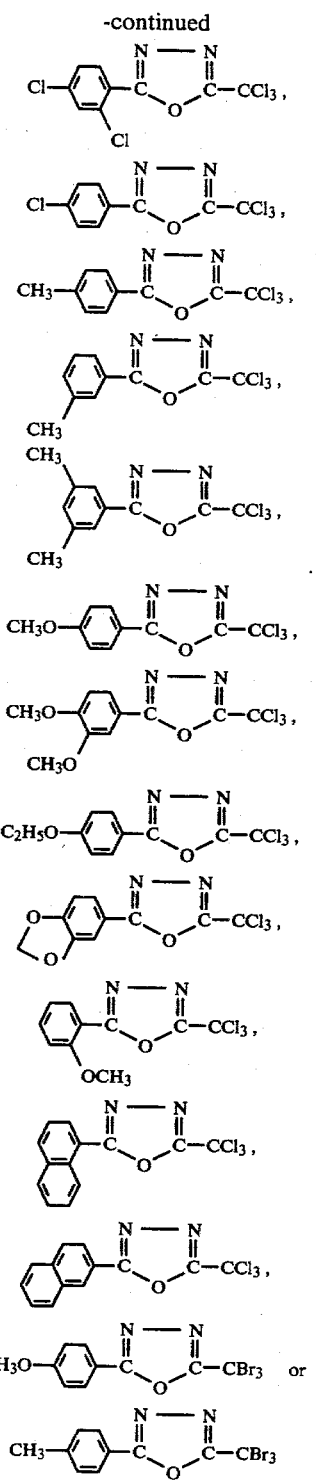

20. The printout composition of claim 4, wherein the compound of the formula (I) is

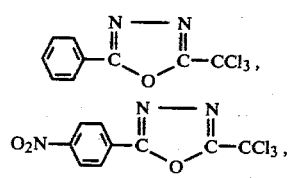

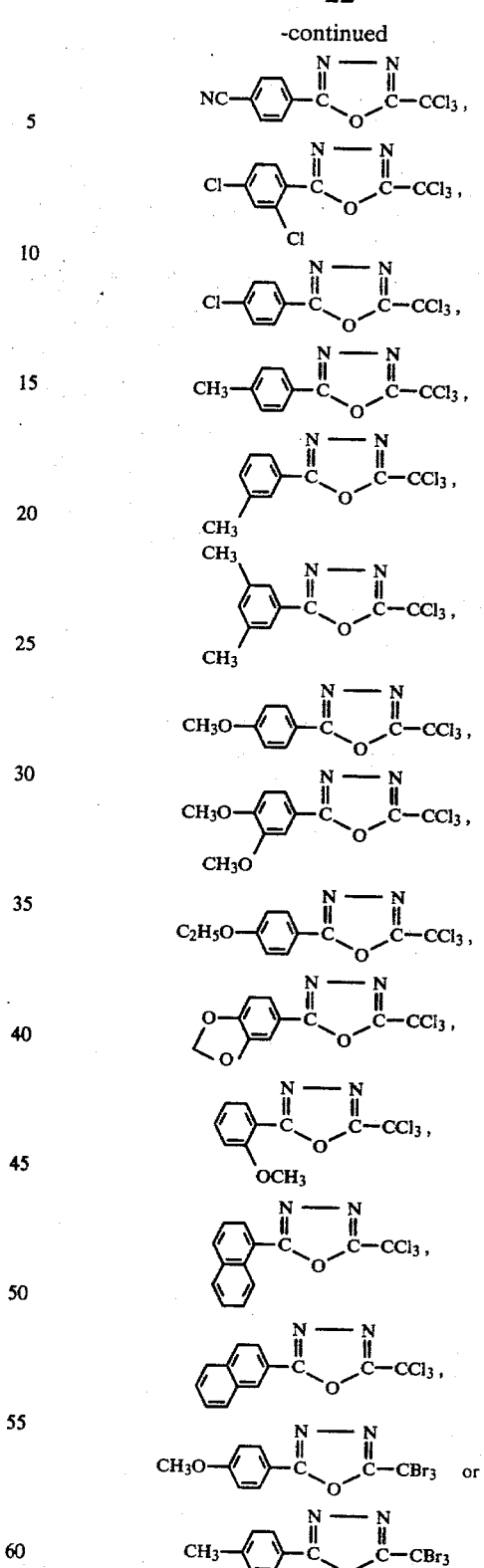

21. In a photopolymerizable composition comprising a vinyl monomer having at least two terminal vinyl groups, a photopolymerization initiator, and a polymeric binder, the improvement characterized in that said photopolymerization initiator is a compound represented by the following general formula:

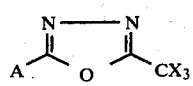
(I)

wherein X represents a chlorine atom or bromine atom and A represents a phenyl group, a naphthyl group or a phenyl or naphthyl group substituted by a halogen atom, an unsubstituted alkyl group, an alkoxy group, a nitro group, a cyano group or a methylenedioxy group.

22. The photopolymerizable composition of claim 21, wherein a weight ratio of the vinyl monomer to the photopolymerization initiator is about 1:9 to 6:4, and the photopolymerization initiator is present in an amount of 0.5 to 10% by weight based on the amount of the vinyl monomer.

23. The photopolymerizable composition of claim 22 wherein the compound of the formula (I) is

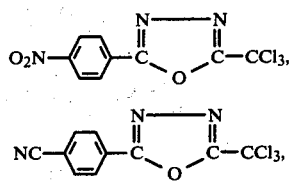

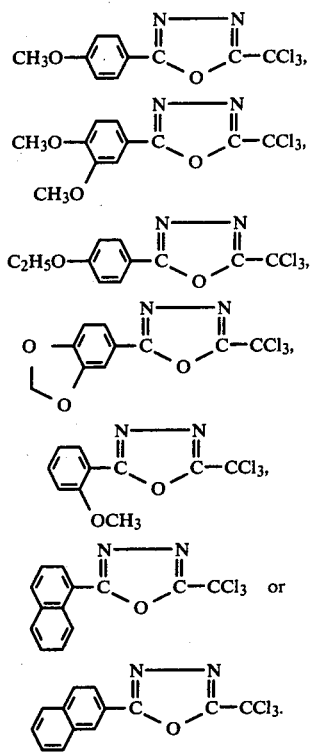

24. The printout composition of claim 1, wherein said discoloring agent is a leuco dye.

* * * * *